United States Patent
Shah

(10) Patent No.: US 9,893,155 B2
(45) Date of Patent: Feb. 13, 2018

(54) SEMICONDUCTOR ELECTRONIC DEVICE FORMED OF 2-D VAN DER WAALS MATERIAL WHOSE FREE CHARGE CARRIER CONCENTRATION IS DETERMINED BY ADJACENT SEMICONDUCTOR'S POLARIZATION

(71) Applicant: U.S. Army Research Laboratory, Washington, DC (US)

(72) Inventor: Pankaj B Shah, Rockville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 18 days.

(21) Appl. No.: 14/938,957

(22) Filed: Nov. 12, 2015

(65) Prior Publication Data

US 2017/0141194 A1    May 18, 2017

(51) Int. Cl.
| | |
|---|---|
| *H01L 29/267* | (2006.01) |
| *H01L 29/205* | (2006.01) |
| *H01L 21/02* | (2006.01) |
| *H01L 29/778* | (2006.01) |
| *H01L 29/66* | (2006.01) |
| *H01L 29/20* | (2006.01) |

(52) U.S. Cl.
CPC ........ *H01L 29/267* (2013.01); *H01L 21/0254* (2013.01); *H01L 21/0262* (2013.01); *H01L 21/02521* (2013.01); *H01L 21/02532* (2013.01); *H01L 21/02568* (2013.01); *H01L 21/02631* (2013.01); *H01L 29/2003* (2013.01); *H01L 29/205* (2013.01); *H01L 29/66462* (2013.01); *H01L 29/7787* (2013.01)

(58) Field of Classification Search
USPC ...................... 257/27, 26; 438/478
See application file for complete search history.

(56) References Cited

U.S. PATENT DOCUMENTS

| | | | | |
|---|---|---|---|---|
| 2006/0054926 | A1* | 3/2006 | Lahreche | H01L 29/155 257/194 |
| 2009/0008678 | A1* | 1/2009 | Ando | H01L 29/7787 257/194 |
| 2016/0087129 | A1* | 3/2016 | Gibertini | H01L 31/028 136/256 |

OTHER PUBLICATIONS

D. Kiriya, et. al., "Air Stable Surface Charge Transfer Doping of MoS2 by Benzyl Viologen", Journal of American Chemical Soc., vol. 136, p. 7853, 2014.
H. Fang, et. al., "Degenerate n-doping of few-layer transition metal dichalcogenides by potassium", Nano Letters, vol. 13, p. 1991, 2013.

(Continued)

*Primary Examiner* — Zandra Smith
*Assistant Examiner* — Lawrence Tynes, Jr.
(74) *Attorney, Agent, or Firm* — Eric Brett Compton

(57) ABSTRACT

Embodiments of the present invention are directed to semiconductor electronic devices formed of 2-D van der Waals material whose free charge carrier concentration is determined by adjacent semiconductor's polarization. According to one particular embodiment, a semiconductor electronic device is composed of one or more layers of two dimensional (2-D) van der Waals (VDW) material; and one or more layers of polarized semiconductor material adjacent to the one or more layer of 2-D VDW material. The polarization of the adjacent semiconductor material establishes the free carrier charge concentration of the 2-D VDW material.

22 Claims, 9 Drawing Sheets

(56) References Cited

OTHER PUBLICATIONS

P. Klopp, et al., "290-fs pulses from a semiconductor disk laser," Opt. Express 16, 5770-5775 (2008).
O. Ambacher, et. al., "Pyroelectric properties of Al(IN)GaN/GaN hetero-and quantum well structures", J. Phys.: Condens. Matter, v. 14, p. 3399, 2002.
V. Fiorentini, et. al., "Evidence for nonlinear macroscopic polarization in III-V nitride alloy heterostructures", Appl. Phys. Lett., vol. 80, p. 1204, 2002.
O. Ambacher, et. al.,"Two dimensional electron gases induced by spontaneous and piezoelectric polarization undoped and doped AlGaN/GaN heterostructures," Journal of Appl. Phys., vol. 87, p. 334, 2000.

\* cited by examiner

SEMICONDUCTOR ELECTRONIC DEVICE FORMED OF 2-D VAN DER WAALS MATERIAL WHOSE FREE CHARGE CARRIER CONCENTRATION IS DETERMINED BY ADJACENT SEMICONDUCTOR'S POLARIZATION

GOVERNMENT INTEREST

The invention described herein may be manufactured, used and licensed by or for the U.S. Government without the payment of royalties thereon.

BACKGROUND OF THE INVENTION

Field

The present invention relates to semiconductor electronic devices, and more particularly to semiconductor devices formed of two dimensional (2-D) van der Waals (VDW) material.

Description of Related Art

In semiconductor electronic devices formed of conventional bulk semiconductors and 2-D VDW material, electrical current flows through both the bulk semiconductors and 2-D VDW materials. The 2-D VDW is doped for electron or hole transport and proper junction electrical characteristics.

Presently, two methods are commonly used to dope the 2-D VDW material: 1) Transfer doping using molecules attached to the surface of the 2-D material, or 2) interstitial/substitutional doping where one replaces certain atoms within the crystal lattice with other atoms of difference valence number. Research in doping the 2-D VDW material is still at a very early stage, but results from these existing methods have not shown them to be very promising for long term reliability or optimum device performance. It also has been found that adding interstitial or substitutional impurities to dope the 2-D VDW material lead to defective materials and reduces the benefits these materials would otherwise offer. This technique is also not as reliable because these atoms desorb from the surface.

Improvements in doping 2-D VDW materials would be beneficial.

BRIEF SUMMARY OF THE INVENTION

Embodiments of the present invention are directed to semiconductor electronic devices formed of 2-D van der Waals material whose free charge carrier concentration is established by adjacent semiconductor's polarization.

According to one embodiment, a semiconductor electronic device is comprised of: one or more layers of two dimensional (2-D) van der Waals (VDW) material; and one or more layers of polarized semiconductor material adjacent to the one or more layer of 2-D VDW material. The polarization of the adjacent semiconductor material establishes the free carrier charge concentration of the 2-D VDW material.

The 2-D VDW material may include: one or more transition metal dichalcogenides, silicene, phosphorene, germanene, boron nitride (BN), bismuth selenide ($Bi_2Se_3$), or any combination thereof. The polarized semiconductor material may include: aluminum gallium nitride ($Al_xGa_{(1-x)}N$), indium gallium nitride ($In_xGa_{(1-x)}N$), aluminum indium nitride ($Al_xIn_{(1-x)}N$), magnesium zinc oxide (MgZnO), aluminum indium gallium nitride (AlxInyGa(1-x-y)N) or any combination thereof. The polarization of the polarized semiconductor material is established by spontaneous polarization and/or piezoelectric polarization of the semiconductor material. The layer(s) of semiconductor material can be positioned above, below, or both above and below the one or more layers of 2-D VDW material. The devices can further include one or more contacts formed on the 2-D VDW material. Depending on the desired application, a device may be configured as a transistor, diode, optoelectronic device, laser, light emitting diode, detector, sensor, thyristor or modulator, for instance.

For a p-type 2-D VDW material layer, the total charge around the 2-D VDW layer is negative to attract holes to the 2-D VDW material layer as the free charge carriers in that region. On the other hand, for an n-type 2-D VDW material layer, the total charge around the 2-D VDW material layer is positive to attract electrons to the 2-D VDW material layer as the free charge carriers in that region. The device can further include a dielectric passivation layer formed on at least a portion of a layer of 2-D VDW material. Due to the polarization of the adjacent semiconductor material, which establishes the free carrier charge concentration of the 2-D VDW material, the 2-D VDW material does not required any conventional doping, such as transfer or substitutional/interstitial doping. At the interface of the 2D VDW material and the semiconductor material there are negligible covalent or ionic bonds.

According to further embodiments, methods of forming a semiconductor electronic device are disclosed. One method includes: forming a layer of two dimensional (2-D) van der Waals (VDW) material; forming one or more layers of polarized semiconductor material contacting the layer of 2-D VDW material; and establishing the polarization of the semiconductor material so as to control the free carrier charge concentration of the 2-D VDW material.

Forming the 2-D VDW material can include: epitaxially growing, or extracting or cleaved from constituent bulk crystals. Moreover, forming the semiconductor material includes, for instance, performing molecular beam epitaxy growth or a vapor deposition process. Preferably, in many embodiments, the method does not include any transfer or substitutional/interstitial doping of the 2-D VDW material. Also, doping through defect generation should generally be avoided. Establishing the polarization of the semiconductor material includes establishing the spontaneous polarization and/or piezoelectric polarization of the semiconductor material.

In another embodiment, a field effect transistor is disclosed. It may be formed of a source contact; a drain contact; one or more layers of polarized semiconductor material; one or more layers of two dimensional (2-D) van der Waals (VDW) material contacting the layer of semiconductor material and forming a channel between the source and drain contacts; and a gate contact which controls carrier charge transfer in the channel. The polarization of the semiconductor material establishes the free carrier charge concentration of the 2-D VDW material. The 2-D VDW material may be configured as an n-type or a p-type semiconductor. The transistor can further include a dielectric passivation layer formed on at least a portion of the layer of 2-D VDW material which isolates the source and drain contacts from the gate contact.

And according to yet other embodiments, methods of modifying the energy gap of an electronic device are disclosed. One such method includes gradually varying the composition of the polarized semiconductor material to gradually modify the energy gap of the semiconductor material and modify the surface charge at an interface of the 2-D VDW material and the semiconductor material. This may include forming the semiconductor material to have a graded composition.

These and other embodiments of the invention are described in more detail, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments, including less effective but also less expensive embodiments which for some applications may be preferred when funds are limited. These embodiments are intended to be included within the following description and protected by the accompanying claims.

DETAILED DESCRIPTION OF THE INVENTION

Figure 1:
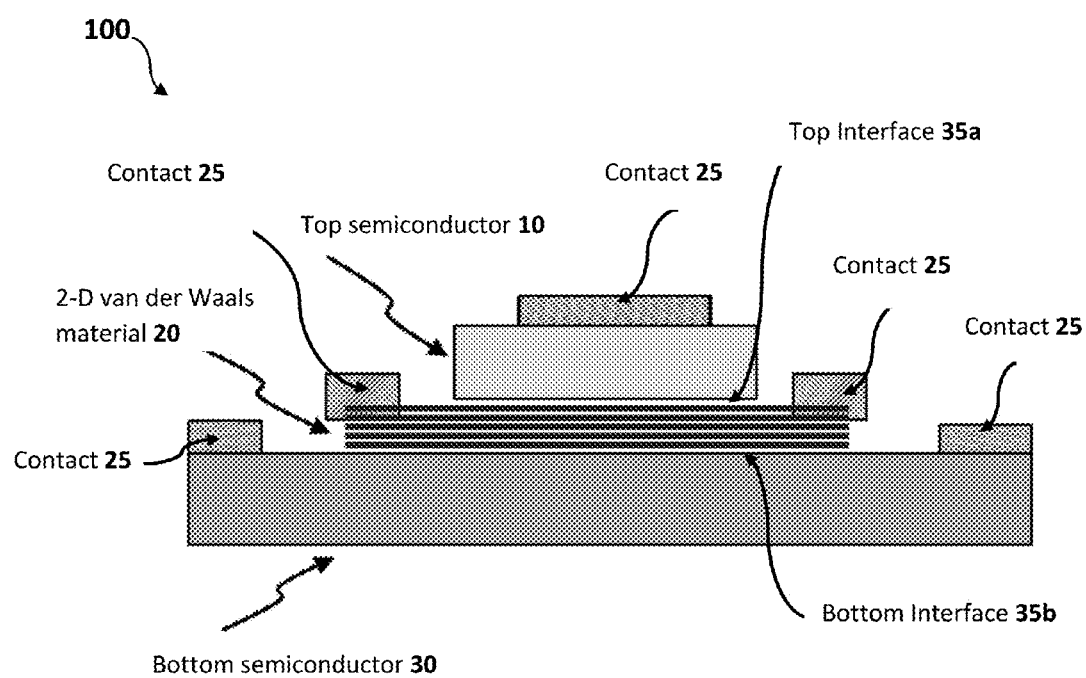
FIG. 1 illustrates an exemplary semiconductor electronic device formed of 2-D van der Waals material whose free charge carrier concentration is determined by adjacent semiconductor's polarization according to an embodiment of the invention.

The present invention leverages polarization within semiconductor material to controllably create free charge carriers in a two dimensional (2-D) van der Waals (VDW) material adjacent to the semiconductor material in electronic devices. Such devices may include, but are not limited to, transistors, diodes, optoelectronic devices, lasers, light emitting diodes, detectors, sensors, thyristors and modulators.

As used herein, the term "polarization," means separation of accumulated charge in a crystalline lattice producing an internal electric field. The accumulated charge may be positive or negative according to convention. And the terms "polarized" and "polar" by extension, mean having a state of polarization. The polarization of the semiconductor material introduces interface charges that act on the adjacent 2-D VDW material. In turn, this controls the free charge carriers in the 2-D VDW material in a manner similar to doping. More specifically, if the surface charge of a polar semiconductor material, resulting from spontaneous and/or piezoelectric polarization is positive at its surface adjacent to a 2D layer, this positive charge will attract electrons from other regions and the electrons can reside fully in the 2D layer if its band alignment is such as to provide a lower energy state than the polar bulk material. Polarization resulting in a negative charge at the semiconductor surface, on the other hand, will attract holes from other regions.

This provides a reliable alternative to conventional doping techniques for 2-D VDW material to render n-type or p-type as required for many electronic or optoelectronic applications. Using proper compositions of the compounds and alloys that form the semiconductor material layer(s), the polarization charge can be adjusted at the interfaces between the semiconductor material layer(s) and the 2-D VDW material so as to attract free carrier charges of the opposite type in the 2-D VDW material for desirable electronic or optoelectronic device performance. In this way, there is no need for doping the 2-D VDW material using conventional, less reliable, and more damaging methods, such as transfer doping or substitutional/interstitial doping of the 2-D VDW material. This largely eliminates or at least greatly reduces the need for conventional doping.

In general, 2-D VDW materials are a family of materials which have a 2-D atomic crystal structure. They may be formed of one or more layers with each layer formed of individual crystalline atomic plane(s) held together by Van der Waals forces. The layers may be formed of the same or different material compositions having a 2-D atomic structure as further discussed below. The 2-D VDW material layer(s) may be produced either from a bottom-up synthesis process (e.g. Van der Waals epitaxial growth) or extracted/cleaved from constituent bulk crystals. In some embodiments, an individual crystalline atomic plane may be cleaved from a bulk homogeneous crystal structure, or it may be cleaved from a heterogeneous crystal structure synthesized using artificial crystal synthesis techniques that are known to persons skilled in the art. The cleaving process may be done, for example, by mechanical exfoliation and/or chemical exfoliation techniques that are known to persons skilled in the art. These planes together form a generally two-dimensional structure defined in the x- and y-directions, but have a very small depth defined in the z-direction relative to its dimensions in the x-y plane (i.e., Dx, Dy>>Dz). These layers may also be grown by physical vapor transport, chemical vapor transport, chemical vapor deposition, molecular beam epitaxy, or atomic layer deposition techniques. The number of layers can vary from a monolayer, up to about ten layers, beyond which it is usually considered bulk.

Both the 2-D VDW material and semiconductor material(s) may be formed in a stacked structure, for example. The external cladding layers might be comprised of conventional bulk semiconductor material(s) and the inner layer or region is formed of 2-D VDW materials(s). They might arranged in a vertically-oriented stack in some embodiments. In a stack structure of this type, the 2-D VDW material experiences lateral and/or vertical current flow.

The one or more layers of these materials each form a region having a discrete structure (such as a layer or region) and/or function (such as semiconductor channel) in electronic devices. The specific structure and function will of course depend on a particular electronic device.

Additionally, the one or more layers of 2-D VDW material are located adjacent to one or more layers of semiconductor material. "Adjacent," as used herein, means the next, immediate layer with no intervening or intermediate layers there between. In this arrangement, the adjacent layers of 2-D VDW material and semiconductor material may be considered as directly connecting or contacting one another thereby forming an interface there between. The semiconductor material may be configured as a cladding, in some embodiments, formed on the top, bottom or both of the surfaces of the 2-D VDW material layers. The interface, present between these two material layers, may be characterized as having negligible covalent or ionic bond from the 2D VDW material and the semiconductor material in the ideal case; but, in actuality, some impurities are likely present at the interface due to impure source materials or processing equipment, or intentionally introduced dopants. These impurities may alter the van der Waals forces locally around the impurities to some extent.

The new devices are more reliable than devices formed using conventional doping techniques. Also, there is no degradation of the material quality of the inner or central 2-D VDW material region as occur with conventional interstitial and/or substitutional doping techniques. This invention provides high-performing vertical electronic and optoelectronic devices operating at much higher speeds, power levels, gain and efficiency. With this invention, the material and interface quality between the 2-D VDW material and the external cladding bulk semiconductor materials can be maintained. Also, the band offsets relative to the adjacent semiconductors and the 2-D VDW charge carrier mobility are not detrimentally impacted by the doping mechanism.

Methods of generating free charge carrier concentrations in the 2-D VDW material of a stacked semiconductor structure by the polarization of the semiconductor material layer(s) are also disclosed. The methods in general include introducing polarization in the top semiconductor material layer, the bottom semiconductor material layer, or both layers to controllably set the free carrier charge concentration of the 2-D VDW material layer or region. The polarized semiconductor layer (or layers) can be located below, above, or both below and above the 2-D VDW material layer (or layers).

This invention provides benefits to a wide range of semiconductor devices and applications. With improved material quality and proper choice of the semiconductor and 2-D materials, transistors and other electronic device can be formed that generate less heat, thus making them ideal for high temperature or high power applications. Their high power added efficiency along with their low on voltage and low die-area specific on-resistance and high transconductance at low drive voltage are also a plus for high power applications. Such devices would also be great for low noise applications due to their low flicker noise. Furthermore, they can provide transistors for systems requiring electrostatic discharge robustness. For instance, lasers, light emitting diodes, detectors, sensors, and modulators would also benefit from the higher quality 2-D VDW material. Systems using these would exhibit cleaner performance with greater dynamic range and reliability.

FIG. 1 illustrates an exemplary semiconductor electronic device 100 formed of 2-D van der Waals material whose free charge carrier concentration is determined by adjacent semiconductor's polarization according to an embodiment of the invention. This electronic device 100 happens to be configured as a transistor, but various other electronic devices are also envisioned in other embodiments.

The electronic device 100 here is formed of three stacked regions or layers: a top semiconductor layer 10, a central 2-D VDW material layer 20, and a bottom semiconductor layer 30. Additional regions or layers may be present in other embodiments. Current flow both vertical through the stack, and laterally through the center 2-D VDW material layer 20. There are interfaces 35a, 35b located at the junctions and between each of the top and bottom semiconductor layers 10, 30 and the center 2-D VDW material layer 20.

The illustration also depicts electrical contacts 25 on these regions; they are typically metallic. These may be ohmic contacts, for instance. Five contacts 25 are illustrated here which configure the electronic device 100 as a transistor. However, this is merely illustrative of one particular device configuration and it will be appreciated that fewer or more contacts 25 may be provided in other device configuration. Some of the electrical contacts 25 can also be Schottky contacts as an alternative or addition to ohmic contacts.

One or both of the top semiconductor 10 and bottom semiconductor 30 may be formed of a polarized material where the polarization is established by the polarization of one or both of the top and bottom semiconductor layers 10, 30. In some embodiments, only a top or a bottom semiconductor layer may be present.

The top and bottom semiconductor layers 10, 30 may be formed of semiconductor materials which are grown or otherwise formed to have a desired polarization therein. Some exemplary semiconductor materials which may be used for the top semiconductor 10 and/or bottom semiconductor 30 may include various conventional bulk semiconductor materials such as aluminum gallium nitride ($Al_xGa_{(1-x)}N$), indium gallium nitride ($In_xGa_{(1-x)}N$) or aluminum indium nitride ($Al_xIn_{(1-x)}N$), magnesium zinc oxide (Mg-ZnO), or the like, or quarternary item such as aluminum indium gallium nitride (AlxInyGa(1-x-y)N), for instance. The semiconductor material may be grown by any conventional method; these may include molecular beam epitaxy growth or vapor deposition such as metal organic chemical vapor deposition to name a few.

The polarization of the semiconductor materials may be established by piezoelectric polarization, spontaneous polarization, or some combination of both. Spontaneous polarization is due to intrinsic asymmetry of the bonding in the crystal structure. Piezoelectric polarization results from mechanical stress in the structure. These types of polarization are discussed below in more detail. Some degree of each type of polarization may be present in semiconductor materials.

As shown, the 2-D VDW material layer 20 is multilayered, although the 2-D VDW material layer 20 can be formed of one or more layers of 2-D van der Walls materials. These materials may include certain transition metal dichalcogenides, described below, or silicene, black phosphorous (phosphorene), germanene, boron nitride (BN) or bismuth selenide ($Bi_2Se_3$), for instance. Transition metal dichalcogenides have the general formula $TX_2$, where T is a transition metal and X is a chalcogenide. Examples of transition metal dichalcogenides include, but are not limited to molybdenum disulfide ($MoS_2$), tungsten disulfide ($WS_2$), niobium disulfide ($NbS_2$), tantalum disulfide ($TaS_2$), vanadium disulfide ($VS_2$), rhenium disulfide ($ReS_2$), tungsten diselenide (WSe$_2$), molybdenum diselenide (MoSe$_2$), tungsten ditelluride (WTe$_2$), and niobium diselenide (NbSe$_2$). For a multilayer 2-D VDW material layer 20, the composition of each layer may be the same or may be different.

Typically, transition metal dichalcogenides having group IV-A and VI-A transition metals (e.g. Mo, Hf, W) can exhibit superconducting, semiconducting or insulating properties, depending on the band-gap of the material. The unfilled transition-metal d-band determines the band-gap, the dielectric constant, and mobility of the transition metal dichalcogenides. For many applications, the 2-D VDW material will be configured to be semiconducting (i.e., n-type or p-type).

To obtain the proper carrier type of either p-type or n-type in the 2-D VDW material layer 20, one would rely on the polarization charge developed at the upper 2-D VDW material interface 35a, the lower 2-D VDW material interface 35b, or both interfaces 35a and 35b. For instance, to have a p-type 2-D VDW material layer, one could have the polarization of the top region result in a negative charge at the junction between the 2-D VDW material layer and the top semiconductor, and no polarization charge at the bottom interface of the 2-D VDW material layer. The negative charge at the upper junction would attract holes to the inner 2-D VDW material layer making it p-type.

The desired materials for the top and/or bottom semiconductor 10, 30 layers may be selected for desired (or optimal) performance of the device based on gain, high frequency performance, and power handling capability for electronic devices, and wavelength, quantum efficiency, gain, etc.

Factors that play into this determination may include the conduction-band and valence-band offsets at both the upper and lower junctions of the 2-D VDW material, free carrier mobility and effective masses in the different regions, free carrier saturation velocity in the different regions, dielectric constants in the different regions, ability to grow the materials required for the three regions, and/or the amount of spontaneous and piezoelectric polarization the top and bottom semiconductor region materials can exhibit. For some applications, the top semiconductor layer 10, 2-D VDW material layer 20, bottom semiconductor layer 30 may have a thickness of about 1 micrometer, 6 nm, and 8 micrometer, respectively.

In one exemplary embodiment, the electronic device 100 may be a vertical stack formed of aluminum gallium nitride (Al$_{(x)}$Ga$_{(1-x)}$N) as the top semiconductor layer 10, tungsten diselenide (WSe$_2$) as the 2-D VDW material layer 20 of the center region and Al$_{(y)}$Ga$_{(1-y)}$N as the bottom semiconductor layer 30, where x and y are the aluminum compositions of the two regions. To make the WSe$_2$ material layer 20 p-type, the sum of the polarization charges at the upper and lower junctions of the WSe2 2-D VDW layer should be negative.

Figure 2:
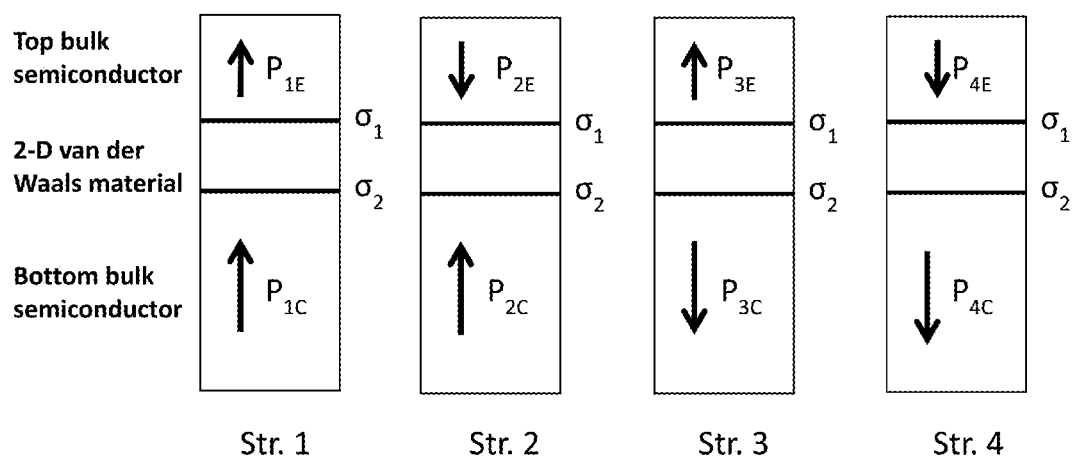
FIG. 2 illustrates various material selections for semiconductor electronic devices based on polarization states according to embodiments of the present invention.

FIG. 2 illustrates various material selections for semiconductor electronic devices based on polarization states according to embodiments of the present invention. The polarization vectors P for the piezoelectric top and/or bottom semiconductor layers can be summed to provide the proper charges at the interfaces. The arrows depict the total polarization vector formed by summing the spontaneous polarization and piezoelectric polarization vectors in a particular layer of the device. An upwardly pointing arrow indicates positive polarization and a downwardly pointing arrow indicated negative polarization. When both the top and bottom semiconductor layers are present in the device, there are four different cases.

For case 1 (Str. 1), $P_{1E}$ is the total polarization for the top bulk semiconductor, $P_{1C}$ is the total polarization for the bottom bulk semiconductor; $\sigma_1$ is the total charge, due to the top bulk semiconductor region polarization, at the upper junction; and $\sigma_2$ is the total charge, due to the bottom bulk semiconductor region polarization, at the bottom junction. For the top semiconductor region, $P_{1E}$ is the sum of the piezoelectric polarization and the spontaneous polarization vectors in that region. Similarly, $P_{1C}$ is calculated for that bottom bulk semiconductor region.

The total polarizations for the top and bottom semiconductor layers can be similarly calculated for the other three cases as well. If only one semiconductor layer is present there is only one interface of concern. Then there are only two possible cases positive and negative polarization at that one interface. These cases might look like the bottom halves of str. 1 and str 3.

The polarization of the top and bottom bulk semiconductors affects the corresponding charges $\sigma_1$, $\sigma_2$ at their respective interface (e.g., 35a or 35b in FIG. 1) with the 2-D VDW material layer. For a p-type 2-D VDW material layer, the total charge around the 2-D VDW material layer, $\sigma_1+\sigma_2$, should be negative to attract holes to the 2-D VDW region as the free charge carriers in that region. And, for an n-type 2-D VDW material layer, the total charge around the 2-D VDW material layer, $\sigma_1+\sigma_2$, should be positive to attract electrons to the 2-D VDW material layer as the free charge carriers in that region. For the small thickness of the 2D VDW material layer (e.g., less than about 20 nm), the charges can just add.

Figure 3A:
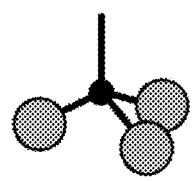
FIGS. 3(A) and 3(B) illustrate examples of spontaneous polarization of two tetragonal bonding geometries for the crystalline structure of semiconductor material which can be used in embodiments of the present invention.
Figure 3B:
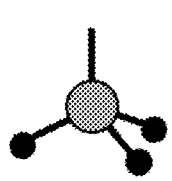

FIGS. 3(A) and 3(B) illustrate examples of spontaneous polarization of two tetragonal bonding geometries for the crystalline structure of semiconductor material which can be used in embodiments of the present invention. The smaller black circles in these figures represent a nitrogen atom and the larger gray circles represents a metal atom (e.g., Ga, Al, or In). Thus, in FIG. 3(A), the crystal is nitrogen face terminated, whereas in FIG. 3(B), the crystal is metal face terminated. The former provides a positive spontaneous polarization in that orientation whereas the latter provides a negative spontaneous polarization in that orientation. However, it will be appreciated that other geometries are also possible. For instance, flipping the crystal over might result in the opposite polarization.

There is a broken bond pointing upward near the top surface of the crystal in each figure. This broken bond represents the location of the interface with the 2-D VDW material. Since the broken bonds are illustrated at the top surfaces, the tetragonal bonding geometries represent bottom semiconductor layer 30 material.

The bottom semiconductor layer 30 material can be grown such that the nitrogen atom has a single broken bond at its top surface and three metal atoms (e.g., Ga, Al, or In) bonded below it as in FIG. 3(A). Then, if the top semiconductor layer 10 material also has this same structure, this results in case 1 (Str.1) shown in FIG. 2. However, if the top semiconductor layer 10 material is flipped over (i.e., so that it has a metal atom on its top surface with a broken bond pointing up and three nitrogen atoms bonded below in a tetrahedral geometry as shown in FIG. 3(B)), one ends up with case 2 (Str. 2) of FIG. 2. This may relate only to spontaneous polarization. Piezoelectric polarization may add to or subtract from that so that the total result may be somewhat different. Recall for instance that, the total polarization is the sum of the spontaneous and piezoelectric charges in that layer.

Figure 4A:
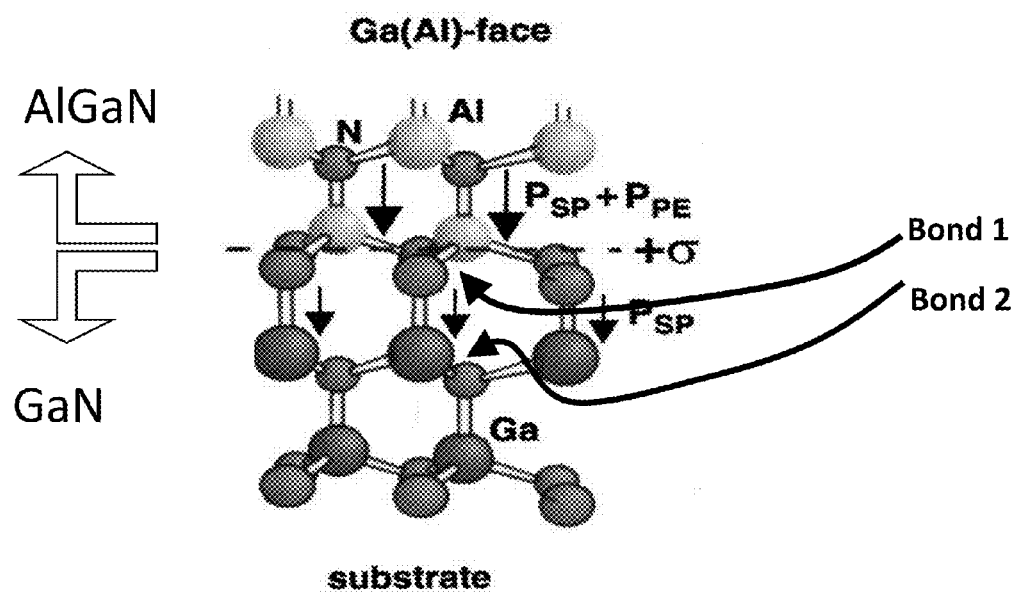
FIGS. 4(A) and 4(B) show an example of piezoelectric polarization within a stacked semiconductor structure which can be used in embodiments of the present invention.
Figure 4B:
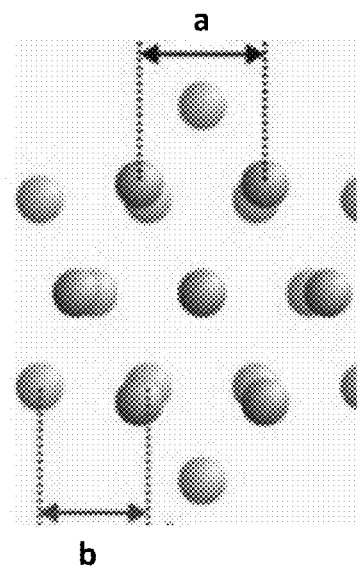

FIGS. 4(A)-4(B) show an example of piezoelectric polarization within a stacked semiconductor structure which can be used in embodiments of the present invention. FIG. 4(A) is a side view of the stacked semiconductor structure, and FIG. 4(B) is a top down view showing the difference in atom spacing of the two stacked layers. In the first figure, $P_{SP}$ indicates the spontaneous polarization direction, $P_{PE}$ indicates the piezoelectric polarization direction, and $+\sigma$ indicates the total interface charge resulting from the polarization. Here, the stack is formed by stacking AlGaN on GaN, although other materials could also be used. The dashed line represents the interface between the substrate GaN and the epitaxial layer AlGaN. There is spontaneous polarization in both of the AlGaN and GaN materials due to their tetragonal bonding geometries. In addition, there is piezoelectric polarization present at their interface. This is because AlGaN and GaN have different atom arrangements and spacings. For instance, Bond 1 is an Al—N bond and Bond 2 is a shorter Ga—N bond. The bond lengths due to the different atoms lead to different charge separation a, b between the atoms in the crystal lattice and therefore introduces an additional component of charge (i.e., piezoelectric polarization) at the interface between the AlGaN and GaN.

The total polarization of bulk semiconductor layers in the electronic device thus can be judiciously selected by controlling the amount of spontaneous polarization, piezoelectric polarization, or both therein.

Figure 5A:
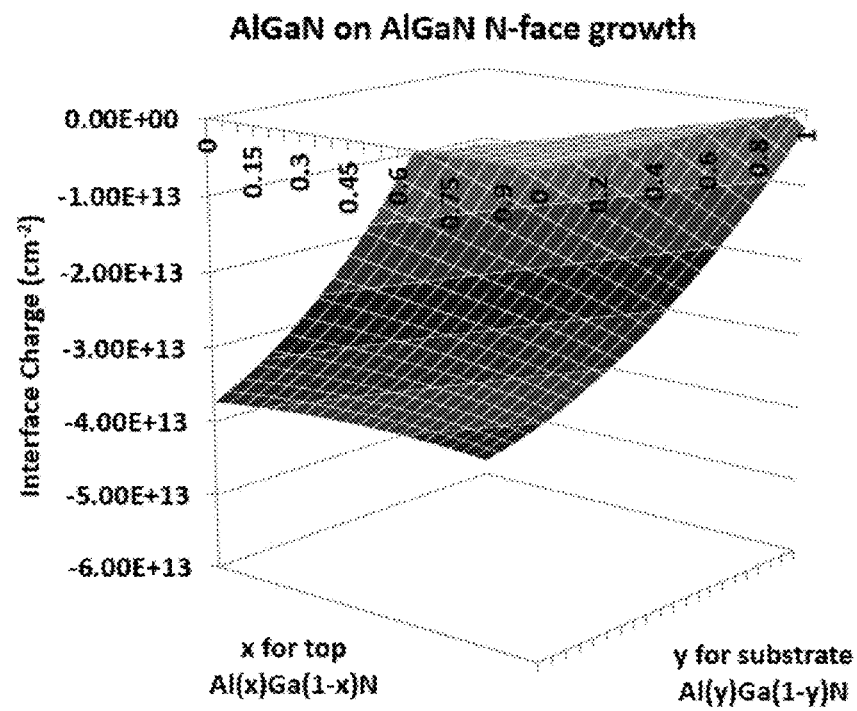
FIGS. 5(A), 5(B) and 5(C) are plots showing calculated interface charge for 2-D van der Waals material based on polarization for some semiconductor materials according to embodiments.
Figure 5B:
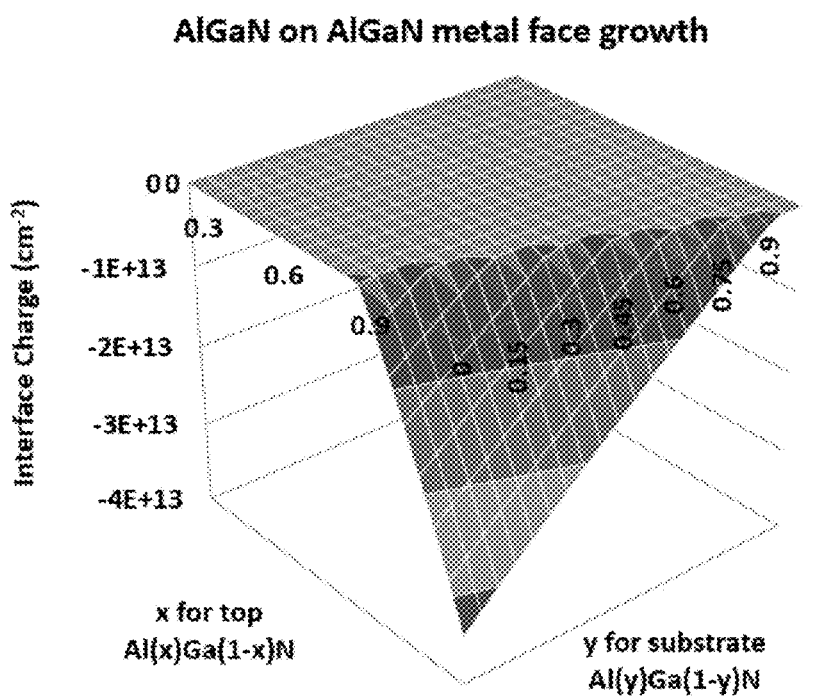
Figure 5C:
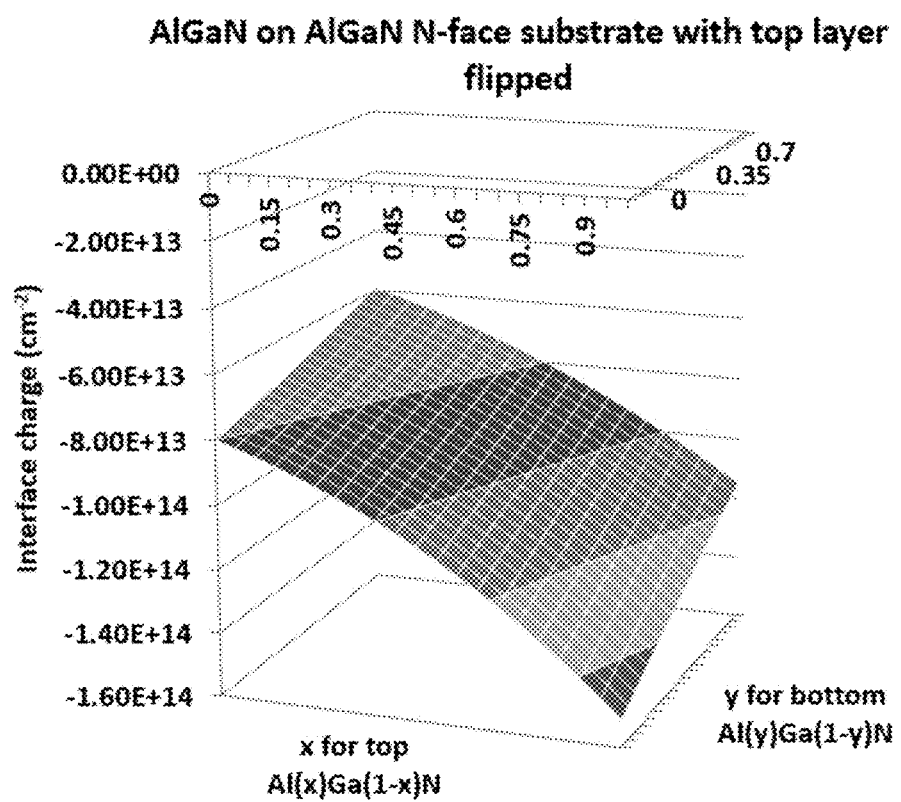

FIGS. 5(A)-5(C) are plots showing calculated interface charge for 2-D van der Waals material based on polarization for some semiconductor materials according to embodiments. The data assumes an upper layer of $Al_{(x)}Ga_{(1-x)}N$, where $0<x<1$ and a bottom layer of $Al_{(y)}Ga_{(1-y)}N$, where $0<y<1$. The values of x and y are varied in the plots. Calculation results indicate the composition "x" of the upper $Al_{(x)}Ga_{(1-x)}N$ layer and composition "y" of the lower $Al_{(y)}Ga_{(1-y)}N$ layer of a stack that will dope a 2-D van der Waals material in the middle p-type. The negative total interface charge leads to the p-type behavior of the 2-D van der Waals layer.

The compositions for the top and bottom layer surfaces to obtain the required negative charge at the 2-D VDW material region interfaces to generate holes are shown in these plots where: FIG. 5(A) corresponds to AlGaN on AlGaN N-face growth which satisfies case 1 (Str. 1) in FIG. 2, FIG. 5(B) corresponds to AlGaN on AlGaN N-face substrate with the top layer flipped which satisfies case 2 (Str. 2) in FIG. 2, and FIG. 5(C) corresponds to AlGaN on AlGaN with metal face growth which satisfied case 4 (Str. 4) in FIG. 2. (It is noted that there was no composition value found yet by the inventor that leads to case 3 (Str 3) in FIG. 2, i.e., having a negative resulting charge at the 2-D VDW region interfaces. But that does not necessary mean that compositions do not exist which satisfy case 3, just that they have yet to be discovered or identified).

The plots in FIGS. 5(A)-5(C) were generated using the equations provided in Vincenzo Fiorentini et al., "Evidence for nonlinear macroscopic polarization in III-V nitride alloy heterostructures," Appl. Phys. Lett., vol. 80, p. 1204 (2002), herein incorporated by reference. This information can be used in conjunction with the calculation of gain, power handling and cutoff frequency of the transistor to make proper tradeoffs where necessary.

In these figures, it can be observed that the interface charge reaches the greatest value for the case where the top layer polarization is opposite to that of the substrate (see FIG. 5(b)). Also very little room for error occurs if one is trying to control the interface charge when growing with the metal face upwards (see FIG. 5(c)). In other words, as the x value changes between 0.75 and 1.0, for the top layer of the case $Al_{(x)}Ga_{(1-x)}N$ on $Al_{(y)}Ga_{(1-y)}N$ with metal face upwards, the charge changes very sharply from 0 to $3.5 \times 10^{13}$ cm$^{-2}$. In the other cases, there is a more gradual change so it will be easier to determine the values.

Figure 6A:
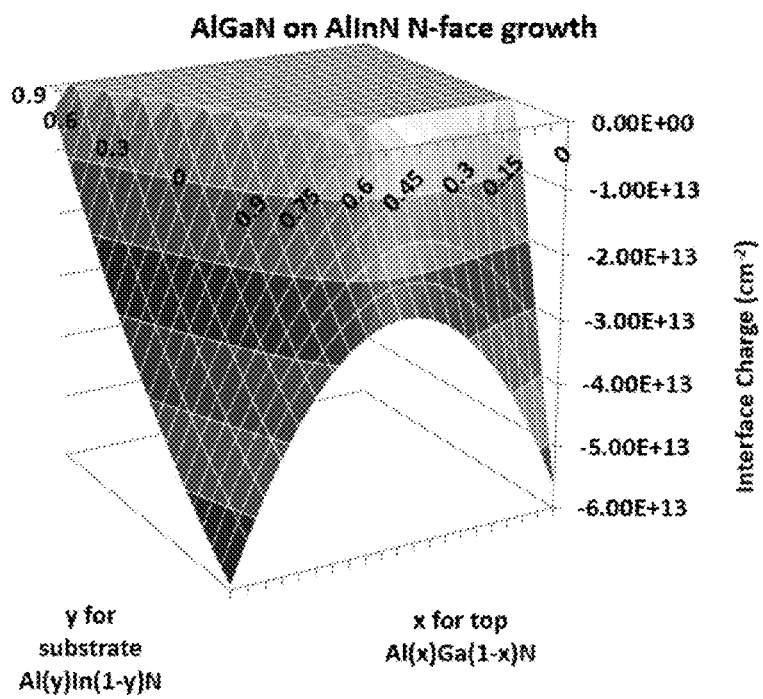
FIGS. 6(A), 6(B) and 6(C) are plots showing calculated interface charge for 2-D van der Waals material based on polarization for bulk semiconductor materials of different alloy compositions according to embodiments.
Figure 6B:
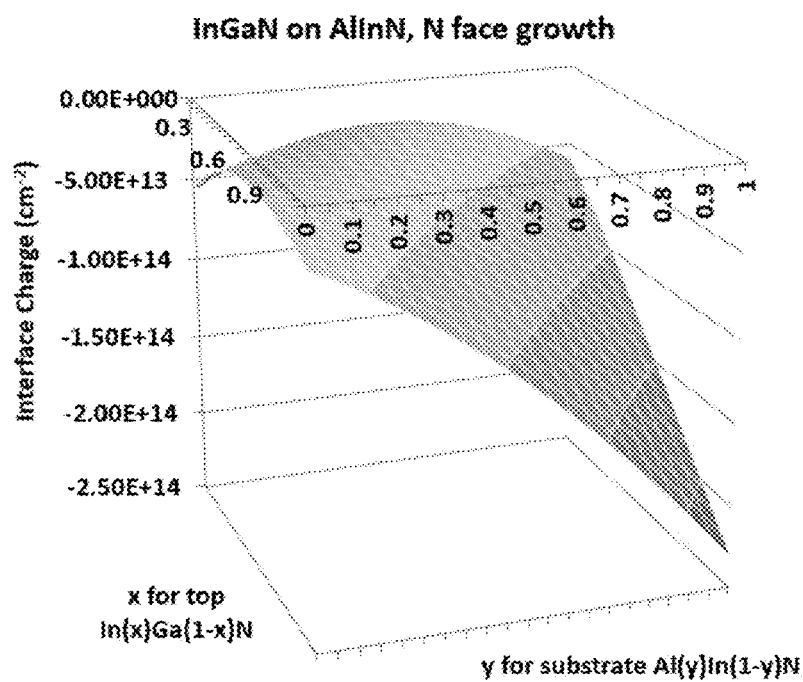
Figure 6C:
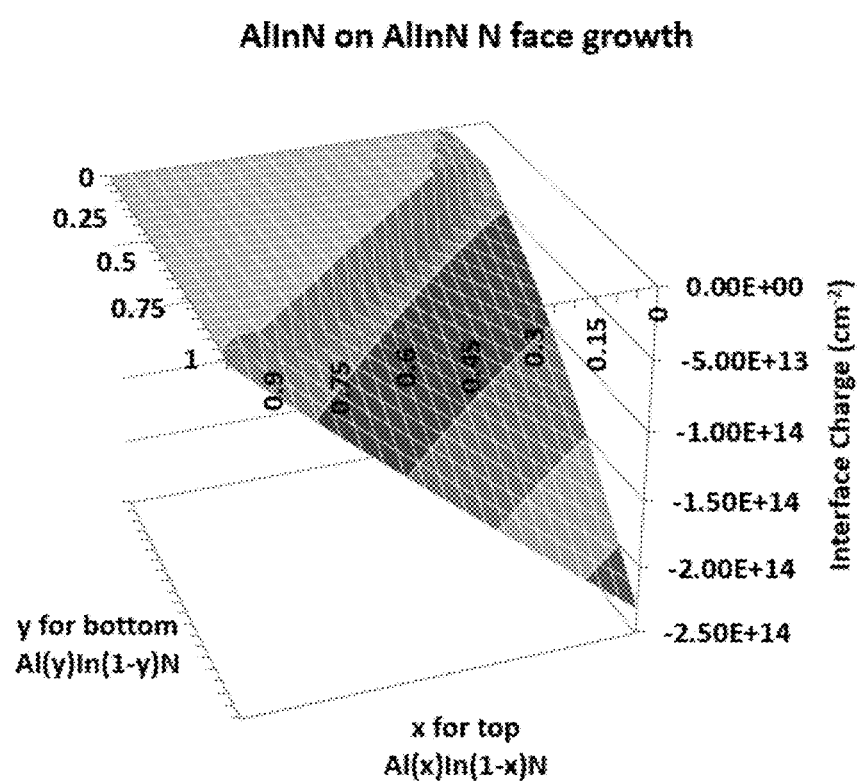

FIGS. 6(A)-6(C) are plots showing calculated interface charge for 2-D van der Waals material based on polarization for bulk semiconductor materials of different alloy compositions according to embodiments. The plots show different alloy compositions in an N-face growth structure, where the top is either $Al_xGa_{(1-x)}N$, $In_xGa_{(1-x)}N$ or $Al_xIn_{(1-x)}N$ stacked on $Al_yIn_{(1-y)}N$, and how they affect the interface charge when fabricating a device.

Calculation results indicate the composition "x" of the upper (a) $Al_{(x)}Ga_{(1-x)}N$ layer, (b) $In_{(x)}Ga_{(1-x)}N$, and (c) $Al_{(x)}In_{(1-x)}N$, and composition "y" of the lower $Al_{(y)}In_{(1-y)}N$ layer of a stack that will dope a 2-D van der Waals material in the middle p-type. The negative total interface charge leads to the p-type behavior of the 2-D van der Waals layer.

Here, it can be seen that the greatest interface charge occurs for the case of AlInN on AlInN with N-face growth. Also, for the case of AlGaN on AlInN with N face growth, it should be appreciated that the surface is very steep indicating that it may be difficult to meet the exact interface charge without strict controls on the material growth.

Being that the center layers are 2-D van der Waals materials, one must consider the fact that piezoelectric polarization may not always be present because of the difficulty to stick atoms to a van der Waals material leading to the lack of strain that would come from direct growth on non-van der Waals materials.

Grading the compositions of the different regions and using more than two layers for either the top or bottom bulk semiconductor region may help with tradeoff considerations and optimizing a device.

Polarization is due to spontaneous polarization, piezoelectric polarization or some combination of both. To produce the 2-D VDW material layer of this vertical stack to be p-type, the polarization directions should be properly chosen of the top bulk semiconductor and bottom bulk semiconductor layers such that to make the 2-D VDW material p-type there should be a net negative charge on the interfaces adjacent to the inner 2-D VDW material that is induced by the polarization of the top and bottom regions. This charge will then attract oppositely charged (positively charged) charge carriers into the inner 2-D VDW material layer leading to a p-type 2-D VDW material layer. Likewise to produce the inner 2-D VDW material layer to be n-type, the polarization directions should be properly chosen of the top bulk semiconductor and bottom bulk semiconductor layers so that there is a net positive charge on the interfaces adjacent to the inner 2-D VDW material layer that is induced by the polarization of the upper and lower bulk semiconductor layers. This charge will then attract oppositely charged (i.e., negatively charged) charge carriers into the inner 2-D VDW material layer leading to an n-type region.

Figure 7:
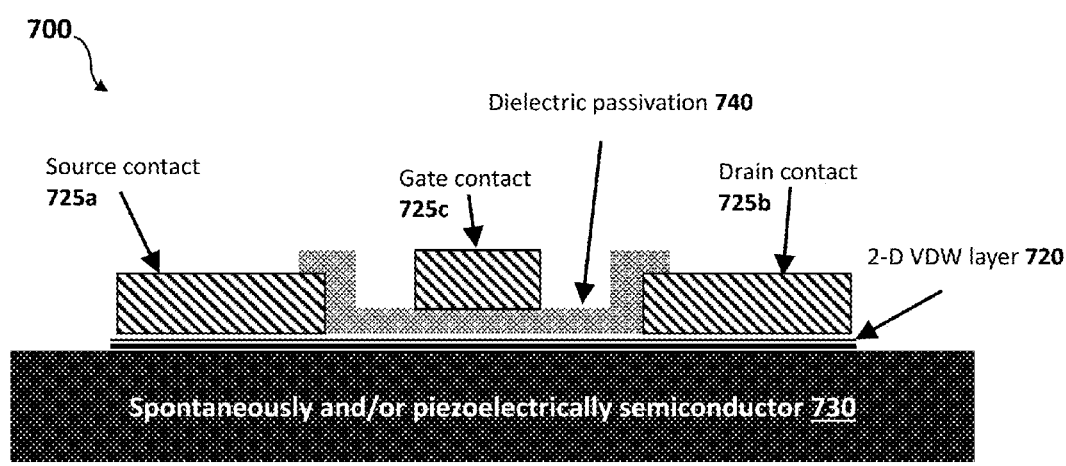
FIG. 7 shows a field effect transistor formed of 2-D VDW material whose free charge carrier concentration is determined by adjacent semiconductor's polarization according to an embodiment of the present invention.

FIG. 7 shows a field effect transistor formed of 2-D VDW material whose free charge carrier concentration is determined by adjacent semiconductor's polarization according to an embodiment of the present invention. The transistor 700 is composed of a 2-D VDW material layer 720 on a spontaneously and/or piezoelectrically polarized semiconductor 730. The spontaneously and/or piezoelectrically polarized semiconductor 730 induces a charge into the 2-D VDW material layer 720.

The transistor 700 includes source, drain and gate contacts 725a, 725b, 725c configuring it to operate as a field effect transistor. The source and drain contacts 725a, 725b are formed directly on the 2-D VDW material layer 720. The 2-D VDW material layer 720 contacts the layer of semiconductor material 730 and forming a channel between the source and drain contacts 725a, 725b. The gate contact 725c controls carrier charge transfer in the channel. A dielectric passivation layer 740 is deposited on a portion of the 2-D VDW material layer 720 to protect the surface, and isolate the source and drain contacts 725a, 725b from the gate contact 725c which is later formed on the passivation layer. Improvement of ohmic contact performance of these contacts can be achieved by increasing the electron concentration in the n-type 2-D VDW material in the region where the contact metal is deposited on the 2-D VDW material. Likewise improvement of the ohmic contact performance can be achieved by increasing the hole concentration in a p-type 2-D VDW material.

Figure 8A:
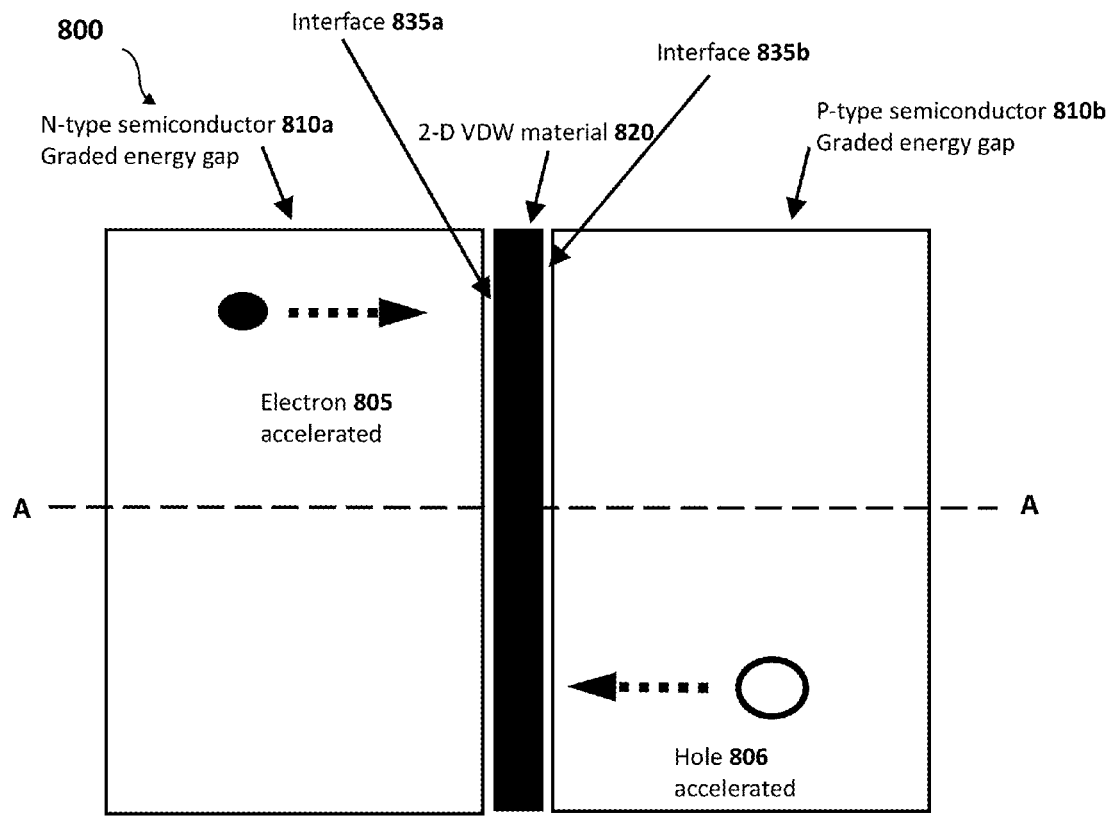
FIGS. 8(A) and 8(B) show modifying the energy gap of a semiconductor electronic device formed of 2-D VDW material whose free charge carrier concentration is determined by adjacent semiconductor's polarization in accordance with embodiments.
Figure 8B:
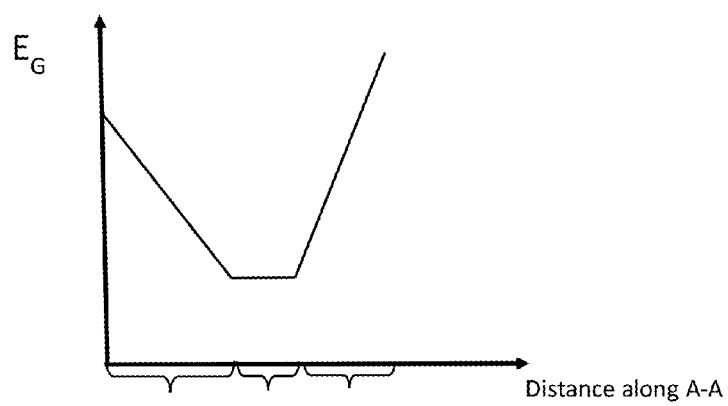

FIGS. 8(A) and 8(B) show modifying the energy gap of a semiconductor electronic device formed of 2-D VDW material whose free charge carrier concentration is determined by adjacent semiconductor's polarization in accordance with embodiments. FIG. 8(A) is a top view schematic of a semiconductor electronic device 800. The electronic device 800 is formed of semiconductor materials 810a, 810b which are adjacent to both sides of 2-D VDW material 820. Semiconductor material layers 810a here is configured to be n-type and graded to accelerate electrons 805 and semiconductor material layer 810b is configured to be p-type and graded to accelerate holes 806. In some embodiments, only one of the semiconductor materials 810a, 810b may be present.

By varying gradually the composition of the external semiconductor material layers 810a, 810b, along with modifying the charge at the interfaces 835a, 835b of the semiconductor material layers 810a, 810b and 2-D VDW material 820, one can also modify the energy gap of the external semiconductor regions to gain from an added electrostatic field of the external regions. This field would accelerate charge carriers into the 2D VDW material 820. (The gaps at 835a and 835b have been exaggerated, the corresponding surfaces of each interface generally are in contact or connecting with one another).

The electrostatic field introduced by the graded energy gap can accelerate charge carriers 805, 806 and minimized recombination in the region where grading is present. "Grading," and by extension "graded," as used here, mean a gradual and continuous change in the energy gap with respect to distance. As an example: for AlGaN semiconductor material (810a, 810b), Al may be in low concentration (e.g., 5%) at the interface with the 2-D material 820 and higher concentration (e.g., 35%) at the opposing surface away from the interface. Typically, grading is linear, but might also be non-linear. Polarization charges increase the total charge in the 2-D VDW material 820 to improve the efficiency (e.g., greater total recombination and light emission).

The charge at the interfaces of the semiconductor material and 2-D VDW material is a result of the spontaneous and piezoelectric polarization of the semiconductor bulk materials. This charge can be controlled by careful grading of the composition and/or controlled lattice mismatch resulting in introduction of appropriate spontaneous and piezoelectric polarization. Thus, through careful design, one can both introduce and electrostatic field in the external semiconductor regions to accelerate charge carriers: electrons 805 and holes 806, and control the doping the 2D VDW layer. Proper design may involve making a tradeoff between surface charge and electrostatic potential for optimum device performance.

FIG. 8(B) is a plot of the energy gap for the semiconductor electronic device 800 illustrated in FIG. 8(A) in direction along line A-A (going from left to right). It shows the semiconductor's energy gap $E_G$ along line A-A for the semiconductor elements of the electronic device 800 of the left semiconductor material 810a, the center 2-D VDW material layer 820, and the right semiconductor layer 810b. The values on the plot are not specific and are merely exemplary. The actual values will vary based on actual composition of the semiconductor materials and/or the spontaneous and piezoelectric polarizations thereof. Nonetheless, the plot shows the graded energy gaps within the semiconductor materials 810a, 810b.

The graded energy gap establishes an internal electrostatic field that will accelerate charge carriers to the 2-D van der Waals material 820. This internal field is a result of the gradual change in conduction band or valence band energy level with position. Thus, when needed—such when making a laser diode, light emitter or light detector—one may take advantage of the combined effects of charge acceleration and doping of the 2D van der Waals material 820 layers by proper choice of composition of the bulk polarized semiconductor layer(s).

This present invention provides a controllable and reliable method of controlling the free carrier charge concentration in a 2-D VDW material layer. It combines the advantages of conventional semiconductor materials and 2-D VDW materials, although, it further allows for higher quality materials that result, producing structures that will lead to excellent devices that exhibit low noise, high gain and efficiency, good electrostatic discharge robustness, and good high power performance. Embodiments of this invention lead to very robust 2-D VDW material-based devices for widespread systems applications. These could be used in high performance analog, RF and mixed signal electronics requiring transistors with cutoff frequencies of 700 GHz and greater along with large voltage swings (large power handling), for instance. Also these devices exhibit very large voltage gains with small power consumption. They are also good for systems requiring low power communications.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, and to describe the actual partial implementation in the laboratory of the system which was assembled using a combination of existing equipment and equipment that could be readily obtained by the inventor, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow.

The invention claimed is:
1. A semiconductor electronic device comprising:
one or more layers of two dimensional (2-D) van der Waals (VDW) material; and
one or more layers of polarized semiconductor material adjacent to the one or more layer of 2-D VDW material, wherein the polarization of the adjacent semiconductor material establishes the free carrier charge concentration of the 2-D VDW material.

2. The device according to claim 1, wherein the 2-D VDW material comprises: one or more transition metal dichalcogenides, silicene, phosphorene, germanene, boron nitride (BN), bismuth selenide ($Bi_2Se_3$) or any combination thereof.

3. The device according to claim 1, wherein the polarized semiconductor material comprises: aluminum gallium nitride ($Al_xGa_{(1-x)}N$), indium gallium nitride ($In_xGa_{(1-x)}N$), aluminum indium nitride ($Al_xIn_{(1-x)}N$), magnesium zinc oxide (MgZnO), aluminum indium, gallium nitride (AlxInyGa(1-x-y)N), or any combination thereof.

4. The device according to claim 1, wherein polarization of the polarized semiconductor material is established by spontaneous polarization and/or piezoelectric polarization of the semiconductor material.

5. The device according to claim 1, wherein the one or more layers of semiconductor material are above, below, or both above and below the one or more layers of 2-D VDW material.

6. The device according to claim 1, further comprising one or more contacts formed on the 2-D VDW material or the adjacent semiconductor materials.

7. The device according to claim 1, wherein the device is configured as a transistor, diode, optoelectronic device, laser, light emitting diode, detector, sensor, thyristor or modulator.

8. The device according to claim 1, wherein (a) the one or more 2-D VDW material layers are p-type with the polarization of the adjacent semiconductor material rendering the total charge around the one or more 2-D VDW material layers negative to attract holes to the one or more 2-D VDW material layers as the free charge carriers in that region; or (b) the one or more 2-D VDW material layers are n-type with the polarization of the adjacent semiconductor material rendering the total charge around the one or more 2-D VDW material layers positive to attract electrons to the one or more 2-D VDW material layers as the free charge carriers in that region.

9. The device according to claim 1, further comprising a dielectric passivation layer formed on at least a portion of a layer of 2-D VDW material.

10. The device according to claim 1, wherein the 2-D VDW material does not include any transfer or substitutional/interstitial doping.

11. The device according to claim 1, wherein at an interface of the 2D VDW material and the semiconductor material there are no covalent or ionic bonds.

12. A method of modifying the energy gap of the device of claim 1, the method comprising:
gradually varying the composition of the polarized semiconductor material to gradually modify the energy gap of the semiconductor material and modify the surface charge at the interface of the 2-D VDW material and the semiconductor material.

13. The method of claim 12, further comprising: forming the semiconductor material to have a graded composition therein.

14. The device according to claim 1, wherein polarized semiconductor material is located above and below the one or more layers of 2-D VDW material.

15. The device according to claim 14, wherein electrical current flows both vertically and laterally through the one or more layers of 2-D VDW material.

16. A method of forming a semiconductor electronic device comprising:
forming one or more layers of two dimensional (2-D) van der Waals (VDW) material;
forming one or more layers of polarized semiconductor material contacting the one or more layers of 2-D VDW material; and
establishing the polarization of the adjacent semiconductor material so as to control the free carrier charge concentration of the 2-D VDW material.

17. The method of claim 16, wherein forming the 2-D VDW material comprises: epitaxially growing, or extracting or cleaved from constituent bulk crystals.

18. The method of claim 16, wherein forming the semiconductor material comprises: performing molecular beam epitaxy growth or a vapor deposition process.

19. The method of claim 16, wherein the method does not include any transfer or substitutional/interstitial doping of the 2-D VDW material.

20. The method of claim 16, wherein establishing the polarization of the semiconductor material comprises: establishing the spontaneous polarization and/or piezoelectric polarization of the semiconductor material.

21. A field effect transistor comprising:
a source contact;
a drain contact;
one or more layers of polarized semiconductor material;
one or more layers of two dimensional (2-D) van der Waals (VDW) material contacting the one or more layers of semiconductor material and forming a channel between the source and drain contacts; and
a gate contact which controls carrier charge transfer in the channel,
wherein the polarization of the adjacent semiconductor material establishes the free carrier charge concentration of the 2-D VDW material.

22. The transistor of claim 21, further comprising a dielectric passivation layer formed on at least a portion of the layer of 2-D VDW material which isolates the source and drain contacts from the gate contact.

* * * * *